United States Patent
Gaska et al.

(10) Patent No.: US 9,287,449 B2
(45) Date of Patent: Mar. 15, 2016

(54) ULTRAVIOLET REFLECTIVE ROUGH ADHESIVE CONTACT

(71) Applicant: Sensor Electronic Technology, Inc., Columbia, SC (US)

(72) Inventors: Remigijus Gaska, Columbia, SC (US); Maxim S. Shatalov, Columbia, SC (US); Alexander Lunev, Columbia, SC (US); Alexander Dobrinsky, Loudonville, NY (US); Jinwei Yang, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 18 days.

(21) Appl. No.: 14/150,949

(22) Filed: Jan. 9, 2014

(65) Prior Publication Data

US 2014/0191398 A1 Jul. 10, 2014

Related U.S. Application Data

(60) Provisional application No. 61/750,452, filed on Jan. 9, 2013.

(51) Int. Cl.
*H01L 29/94* (2006.01)
*H01L 33/22* (2010.01)
(Continued)

(52) U.S. Cl.
CPC ............... *H01L 33/22* (2013.01); *H01L 24/14* (2013.01); *H01L 33/32* (2013.01); *H01L 33/38* (2013.01); *H01L 2924/12041* (2013.01); *H01L 2924/12042* (2013.01); *H01L 2933/0016* (2013.01)

(58) Field of Classification Search
CPC ....... H01L 33/22; H01L 33/36; H01L 33/005; H01L 33/405; H01L 21/6733; H01L 24/14; H01L 2923/0016; H01L 33/38; H01L 33/32; H01L 31/0236; H01L 21/02366; H01L 21/0392
USPC .............. 257/13, 739, 103, 98, 309; 438/669, 438/478, 47, 71, 29, 69
See application file for complete search history.

(56) References Cited

U.S. PATENT DOCUMENTS 5,917,202 A 6/1999 Haitz et al.
6,504,180 B1 1/2003 Heremans et al.
(Continued)

FOREIGN PATENT DOCUMENTS

JP 2010087270 A 4/2012
KR 100661602 B1 12/2006
(Continued)

OTHER PUBLICATIONS

Park, Search Report for International Application No. PCTUS2014010772, May 8, 2014, 13 pages.
(Continued)

*Primary Examiner* — Jarrett Stark
*Assistant Examiner* — Shahed Ahmed
(74) *Attorney, Agent, or Firm* — LaBatt, LLC

(57) ABSTRACT

A device including a first semiconductor layer and a contact to the first semiconductor layer is disclosed. An interface between the first semiconductor layer and the contact includes a first roughness profile having a characteristic height and a characteristic width. The characteristic height can correspond to an average vertical distance between crests and adjacent valleys in the first roughness profile. The characteristic width can correspond to an average lateral distance between the crests and adjacent valleys in the first roughness profile.

23 Claims, 12 Drawing Sheets

(51) Int. Cl.
H01L 23/00 (2006.01)
H01L 33/32 (2010.01)
H01L 33/38 (2010.01)

(56) References Cited

U.S. PATENT DOCUMENTS

| | | | |
|---|---|---|---|
| 6,969,874 B1 | 11/2005 | Gee et al. | |
| 7,187,007 B2 | 3/2007 | Kim et al. | |
| 7,190,004 B2 | 3/2007 | Nagai et al. | |
| 7,193,249 B2 | 3/2007 | Seong et al. | |
| 7,262,436 B2 | 8/2007 | Kondoh et al. | |
| 7,319,247 B2 | 1/2008 | Bader et al. | |
| 7,335,924 B2 | 2/2008 | Liu et al. | |
| 7,355,212 B2 | 4/2008 | Okazaki et al. | |
| 7,485,479 B2 | 2/2009 | Seong et al. | |
| 7,501,295 B2 | 3/2009 | Zhou | |
| 7,611,915 B2 | 11/2009 | Slater, Jr. et al. | |
| 7,612,384 B2 | 11/2009 | Zhou | |
| 7,691,659 B2 | 4/2010 | Bader et al. | |
| 7,714,340 B2 | 5/2010 | Chua et al. | |
| 7,829,359 B2 | 11/2010 | Tang et al. | |
| 7,829,881 B2 | 11/2010 | Yoon | |
| 7,872,272 B2 | 1/2011 | Bour et al. | |
| 7,915,624 B2 | 3/2011 | Jorgenson | |
| 7,973,325 B2 | 7/2011 | Kim et al. | |
| 7,985,979 B2 | 7/2011 | David et al. | |
| 8,217,415 B2 | 7/2012 | Erchak et al. | |
| 2006/0186552 A1 | 8/2006 | Venugopalan | |
| 2007/0134834 A1 | 6/2007 | Lee | |
| 2007/0202624 A1 | 8/2007 | Yoon et al. | |
| 2007/0263286 A1* | 11/2007 | Yamada | G02B 1/118 359/582 |
| 2008/0277686 A1* | 11/2008 | Tsai | H01L 21/0237 257/103 |
| 2009/0242924 A1 | 10/2009 | Lin et al. | |
| 2010/0327300 A1 | 12/2010 | Epler et al. | |
| 2011/0008644 A1* | 1/2011 | Naritomi | B29C 66/73111 428/612 |
| 2011/0101340 A1 | 5/2011 | Son | |
| 2011/0156000 A1* | 6/2011 | Cheng | H01L 33/22 257/13 |
| 2012/0168803 A1 | 7/2012 | Lee et al. | |
| 2012/0217473 A1 | 8/2012 | Shur et al. | |
| 2013/0146907 A1 | 6/2013 | Lunev et al. | |
| 2013/0248816 A1* | 9/2013 | Chu | H01L 33/22 257/13 |
| 2014/0131731 A1 | 5/2014 | Kim et al. | |

FOREIGN PATENT DOCUMENTS

| KR | 1020110138755 A | 12/2011 |
|---|---|---|
| KR | 101165258 B1 | 7/2012 |

OTHER PUBLICATIONS

Ban et al., "Ir/Ag reflector for high-performance GaN-based near UV light emitting diodes", Materials Science and Engineering: B 133, Aug. 2006, pp. 26-29, No. 1-3.
Ban et al., "Use of an indium zinc oxide interlayer for forming Ag-based Ohmic contacts to p-type GaN for UV-light-emitting diodes", Semiconductor Science and Technology 20, Sep. 2005, pp. 921-924, No. 9.
Chang et al., "High reflective p—GaN/Ni/Ag/Ti/Au Ohmic contacts for flip-chip light-emitting diode (FCLED) applications", Applied Surface Science 255, Apr. 2009, pp. 6155-6158, No. 12.
Chen et al., "Highly Reflective Ag/La Bilayer Ohmic Contacts to p-Type GaN", Journal of the Electrochemical Society 158, 2011, pp. H285, No. 3.
Chou et al., "High thermally stable Ni/Ag(Al) alloy contacts on p—GaN", Applied Physics Letters 90, 2007, pp. 022103, No. 2.
Hagio et al., "Interface Properties between Ni and p—GaN Studied by Photoemission Spectroscopy", Japanese Journal of Applied Physics 41, Apr. 2002, pp. 2493-2496, No. Part 1, No. 4B.
Hibbard et al., "Low resistance high reflectance contacts to p—GaN using oxidized Ni/Au and Al or Ag", Applied Physics Letters 83, 2003, pp. 311, No. 2.
Kim et al., "High-reflectivity Al—Pt nanostructured Ohmic contact to p—GaN", IEEE Transactions on Electron Devices 53, Oct. 2006, pp. 2448-2453, No. 10.
Hong-Xia et al., "A Novel Ni/Ag/Pt Ohmic Contact to P-Type GaN for Flip-Chip Light-Emitting Diodes", Chinese Physics Letters 23, Aug. 2006, pp. 2299-2302, No. 8.
Horng et al., "Low-resistance and high-transparency Ni/indium tin oxide ohmic contacts to p-type GaN", Applied Physics Letters 79, 2001, pp. 2925, No. 18.
Hwang et al., "Electrical and thermal stability of Ag ohmic contacts for GaN-based flip-chip light-emitting diodes by using an AgAl alloy capping layer," Materials Science in Semiconductor Processing 10, Feb. 2007, pp. 14-18, No. 1.
Jang et al., "Mechanism for ohmic contact formation of Ni/Ag contacts on p-type GaN", Applied Physics Letters 85, 2004, pp. 5920, No. 24.
Jang et al., "The role of reflective p-contacts in the enhancement of light extraction in nanotextured vertical InGaN light-emitting diodes", Nanotechnology 21, Jan. 2010, pp. 025203, No, 2.
Jang et al., "Formation of High-Quality Ag-Based Ohmic Contacts to p-Type GaN", Journal of the Electrochemical Society 155, 2008, pp. H563, No. 8.
Jang et al., "Highly reflective low resistance Ag-based Ohmic contacts on p-type GaN using Mg overlayer", Applied Physics Letters 90, 2007, pp. 012106, No. 1.
Jang et al., "Mechanisms for the reduction of the Schottky barrier heights of high-quality nonalloyed Pt contacts on surface-treated p—GaN", Journal of Applied Physics 88, pp. 3064, No. 5.
Jung et al., "Improved electrical and thermal properties of Ag contacts for GaN-based flip-chip light-emitting diodes by using a NiZn alloy capping layer", Superlattices and Microstructures 46, Oct. 2009, pp. 578-584, No. 4.
Jung et al., "Improved Light Output of GaN-Based Light-Emitting Diodes by Using AgNi Reflective Contacts", Journal of Electronic Materials 40, Sep. 2011, pp. 2173-2178, No. 11.
Kim et al., "Low-resistance and highly transparent Ag/IZO ohmic contact to p-type GaN", Thin Solid Films 517, May 2009, pp. 4039-4042, No. 14.
Kim et al., "Performance characteristics of GaN-based light-emitting diodes fabricated with AgNi, AgCu, and AgAl-alloy reflectors", Journal of Vacuum Science & Technology B: Microelectronics and Nanometer Structures 29, 2011, pp. 011032, No. 1.
Kim et al., "Highly Reflective and Low-Resistant Ni/Au/ITO/Ag Ohmic Contact on p-Type GaN", Electrochemical and Solid-State Letters 7, 2004, pp. G102, No. 5.
Leem et al., "Formation of High-Quality Ohmic Contacts to p—GaN for Flip-Chip LEDs Using Ag/TiN[sub x]Al", Electrochemical and Solid-State Letters 8, 2005, pp. G150, No. 6.
Lin et al., "Nitride-based light-emitting diodes with Ni/ITO p-type ohmic contacts", IEEE Photonics Technology Letters 14, Dec. 2002, pp. 1668-1670, No. 12.
Margalith et al., "Indium tin oxide contacts to gallium nitride optoelectronic devices", Applied Physics Letters 74, 1999, pp. 3930, No. 26.
Nakahara et al., "Improved External Efficiency InGaNBased Light-Emitting Diodes with Transparent Conductive Ga-Doped ZnO as p-Electrodes", Japanese Journal of Applied Physics 43, Jan. 2004, pp. L180-L182, No. 2.
Seong-Han et al., "Thermally Stable and Reflective RhZn/Ag Ohmic Contacts to p-type GaN for Near-UV Flip-chip Light-emitting Diodes", Journal of the Korean Physical Society 59, Jul. 2011, pp. 156, No. 1.
Pan et al., "Enhanced output power of InGaN—GaN light-emitting diodes with high-transparency nickel—oxide—indiumtin—oxide ohmic contacts", IEEE Photonics Technology Letters 15, May 2003, pp. 646-648, No. 5.
Sohn et al., "Formation of Nonalloyed Low Resistance Ni/Au Ohmic Contacts to p-Type GaN Using Au Nanodots", Electrochemical and Solid-State Letters 7, 2004, pp. G179, No. 9.

(56) References Cited

OTHER PUBLICATIONS

Song et al., "Effect of Pt and Ti on Ni/Ag/(Pt or Ti)/Au p-ohmic contacts of GaN based flip-chip LEDs", Applied Surface Science 257, Jul. 2011, pp. 8102-8105, No. 18.

Song et al., "Improvement of the electrical performance of near UV GaN-based light-emitting diodes using Ni nanodots", Solid-State Electronics 49, Dec. 2005, pp. 1986-1989, No. 12.

Song et al., "Low Resistance and Reflective Mg-Doped Indium Oxide–Ag Ohmic Contacts for Flip-Chip Light-Emitting Diodes", IEEE Photonics Technology Letters 16, Jun. 2004, pp. 1450-1452, No. 6.

Song et al., "Ohmic-Contact Technology for GaN-Based Light-Emitting Diodes: Role of P-Type Contact", IEEE Transactions on Electron Devices 57, Jan. 2010, pp. 42-59, No. 1.

Song et al., "Highly low resistance and transparent Ni/ZnO ohmic contacts to p-type GaN", Applied Physics Letters 83, 2003, pp. 479, No. 3.

Song et al., "Highly transparent Ag/SnO[sub 2] ohmic contact to p-type GaN for ultraviolet light-emitting diodes", Applied Physics Letters 85, 2004, pp. 6374, No. 26.

Song et al., "Effects of Mg Additive on Inhibition of Ag Agglomeration in Ag-Based Ohmic Contacts on p—GaN", Electrochemical and Solid-State Letters 13, 2010, pp. H173, No. 6.

Song et al., "Domain Matching Epitaxy of Mg-Containing Ag Contact on p-Type GaN", Crystal Growth & Design 11, Jun. 2011, pp. 2559-2563, No. 6.

Sun et al, "p—GaN surface treatments for metal contacts", Applied Physics Letters 76, 2000, pp. 415, No. 4.

Tamura et al., "InGaN-based light-emitting diodes fabricated with transparent Ga-doped ZnO as ohmicp-contact", Phys. stat. sol. (a) 201, Sep. 2004, pp. 2704-2707, No. 12.

Yamada et al., "InGaNBased Near-Ultraviolet and Blue-Light-Emitting Diodes with High External Quantum Efficiency Using a Patterned Sapphire Substrate and a Mesh Electrode", Japanese Journal of Applied Physics 41, Dec. 2002, pp. L1431-L1433, No. 12B.

Kim et al., "Low-resistance contacts to p-type GaN", Mater. Res. Soc. Symp. Proc. 449,1997, pp. 1061.

Chu et al., "Low-resistance ohmic contacts on p-type GaN using Ni/Pd/Au metallization", Applied Physics Letters 77, 2000, pp. 3423, No. 21.

Fung et al., "A study of the electrical characteristics of various metals on p-type GaN for ohmic contacts", Journal of Electronic Materials 28, May 1999, pp. 572-579, No. 5.

Jang et al., "Ohmic contacts to p-type GaN using a Ni/Pt/Au metallization scheme", Journal of Vacuum Science & Technology B: Microelectronics and Nanometer Structures 16, Nov. 1998, pp. 3105, No. 6.

Jang et al., "Low-resistance Pt/Ni/Au ohmic contacts to p-type GaN", Applied Physics Letters 74, 1999, pp. 70, No. 1.

Song et al., "High-quality nonalloyed rhodium-based ohmic contacts to p-type GaN", Applied Physics Letters 83, 2003, pp. 2372, No. 12.

Zhou et al., "Low resistance Ti/Pt/Au ohmic contacts to p-type GaN", Applied Physics Letters 76, 2000, pp. 3451, No. 23.

Jang et al., "Low-resistance and thermally stable ohmic contact on p-type GaN using Pd/Ni metallization", Applied Physics Letters 79, 2001, pp. 1822.

Chen et al., "High-reflectivity Pd/Ni/Al/Ti/Au ohmic contacts to p-type GaN for ultraviolet light-emitting diodes", Applied Physics Letters 85, 2004, pp. 2797.

Rideout et al., "A review of the theory and technology for ohmic contacts to group III—V compound semiconductors", Solid-State Electronics 18, Jun. 1975, pp. 541-550.

\* cited by examiner

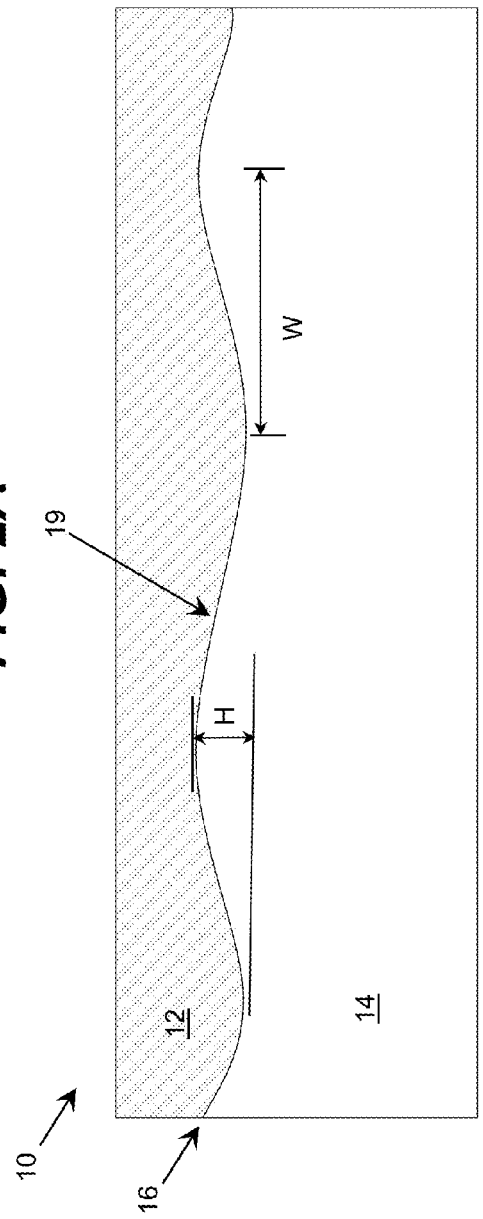
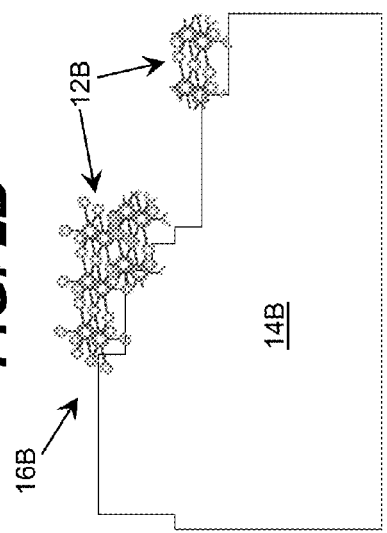

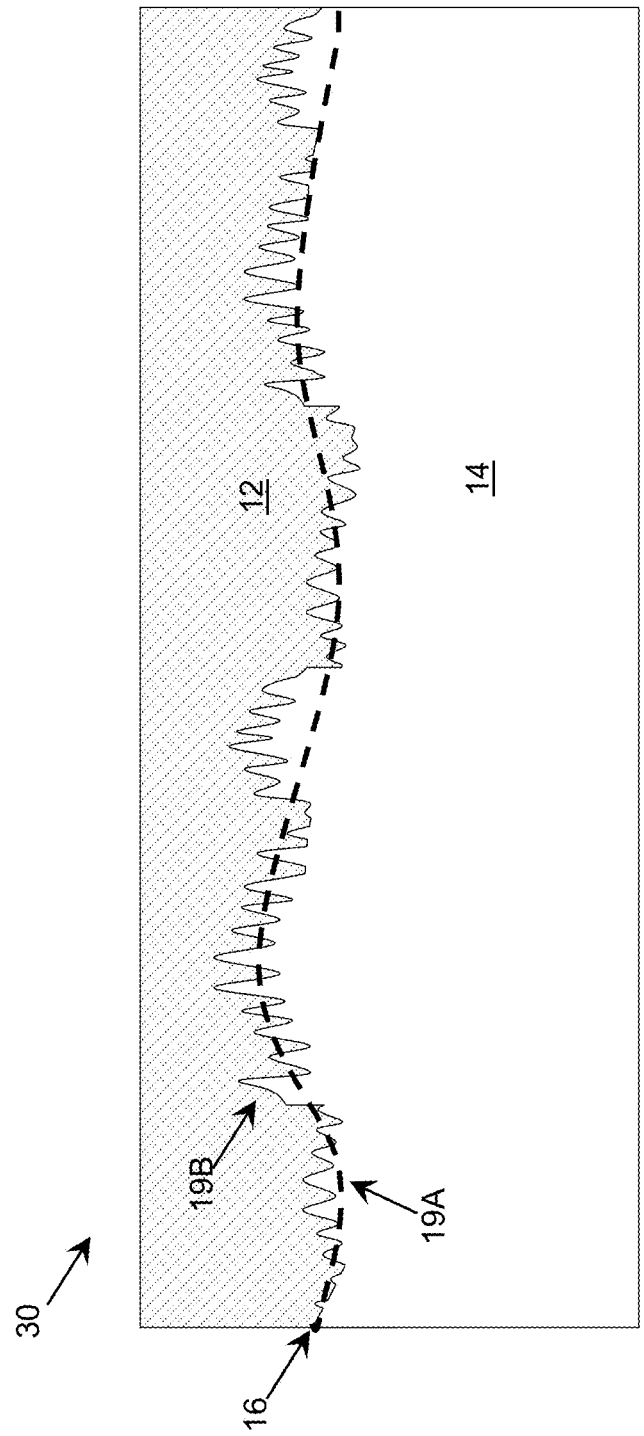

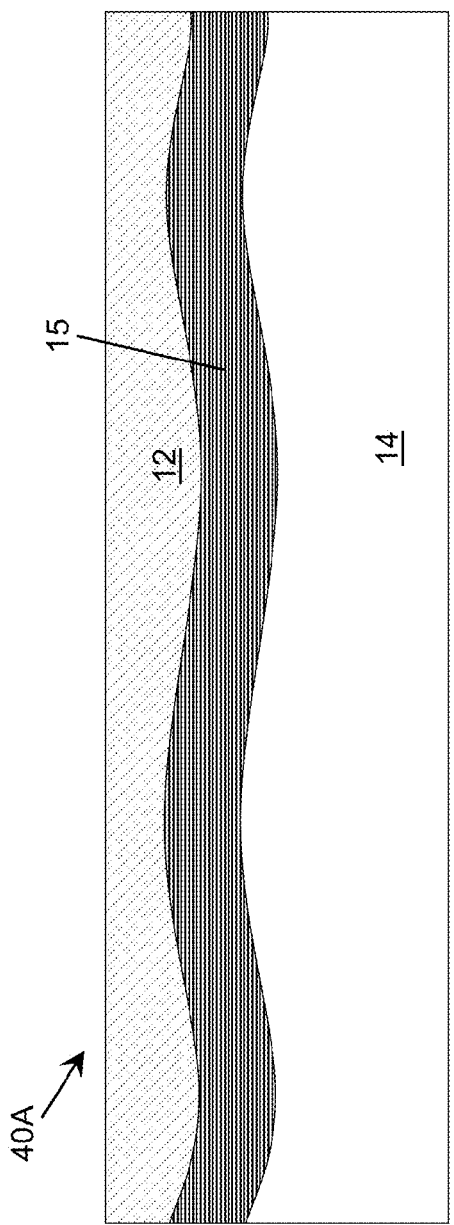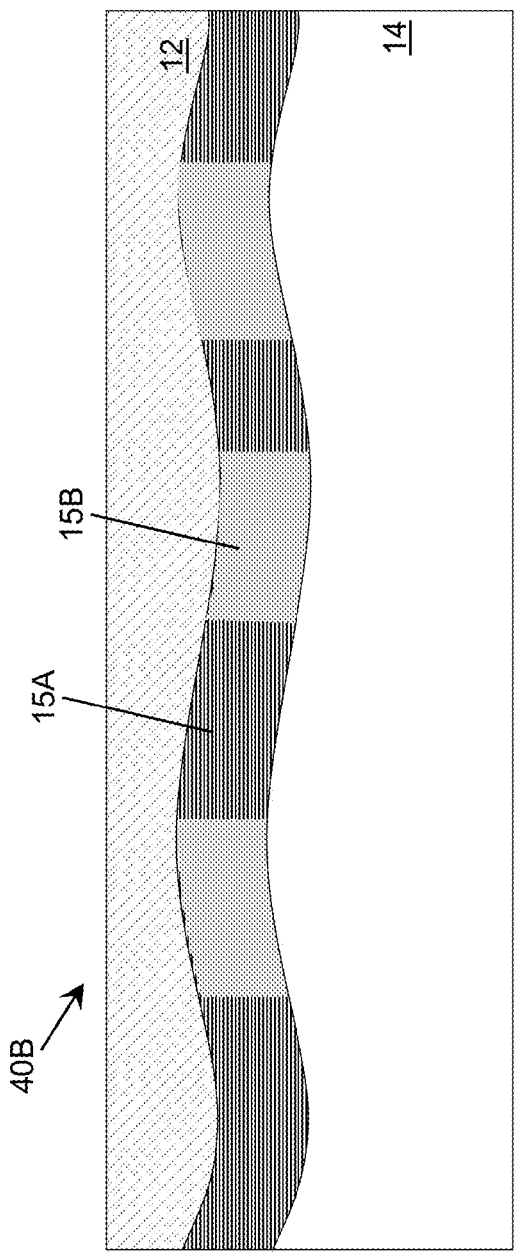

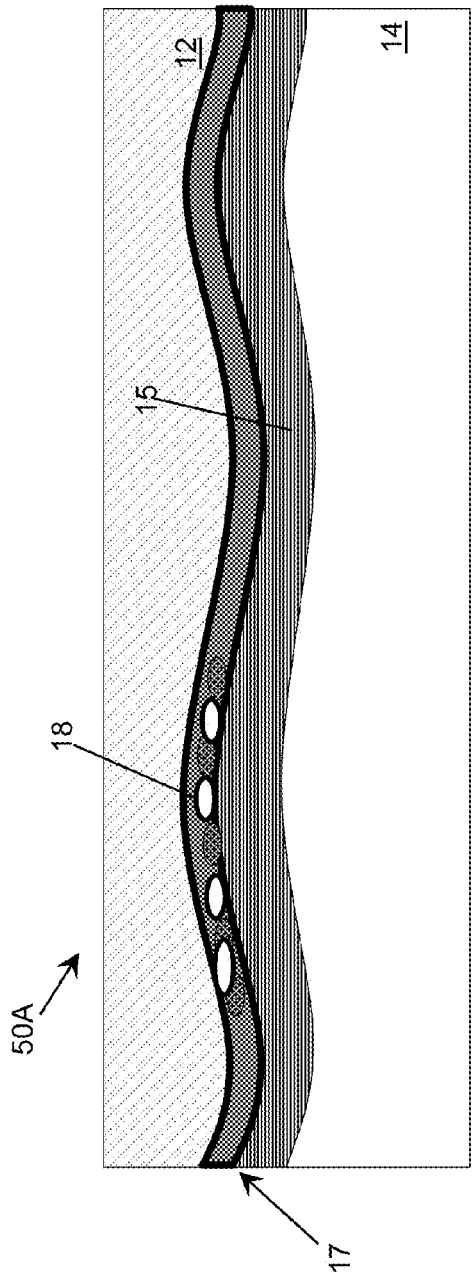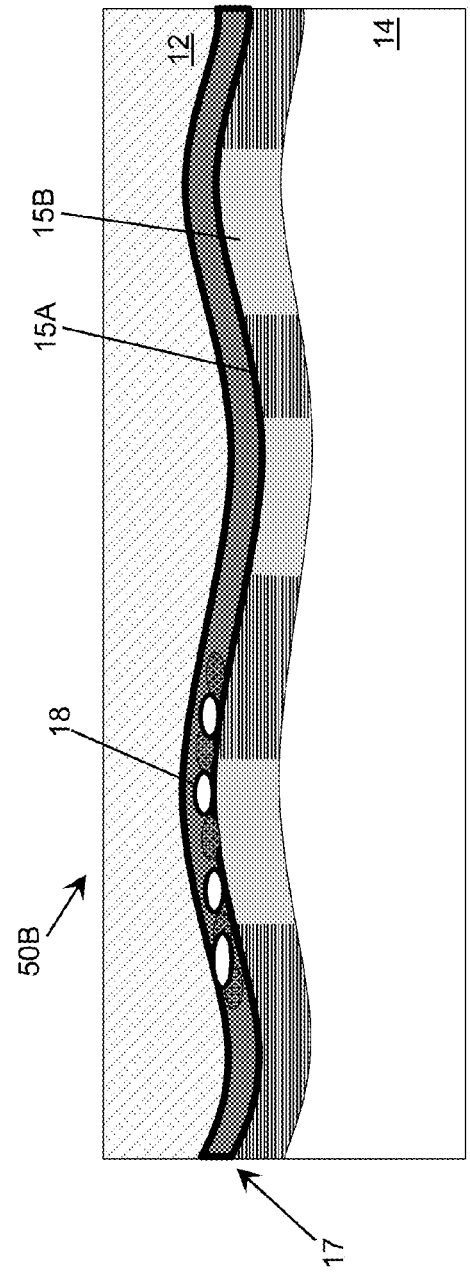

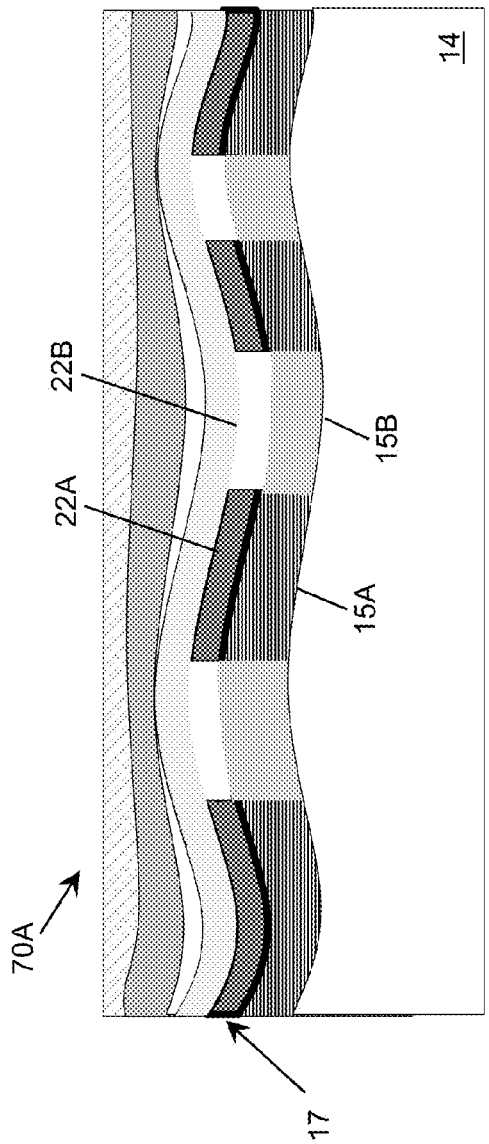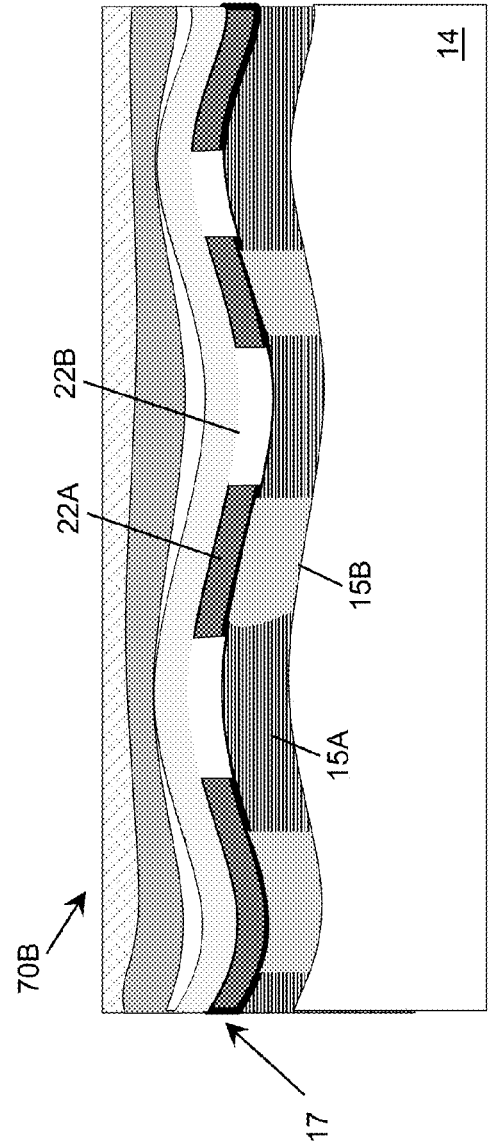

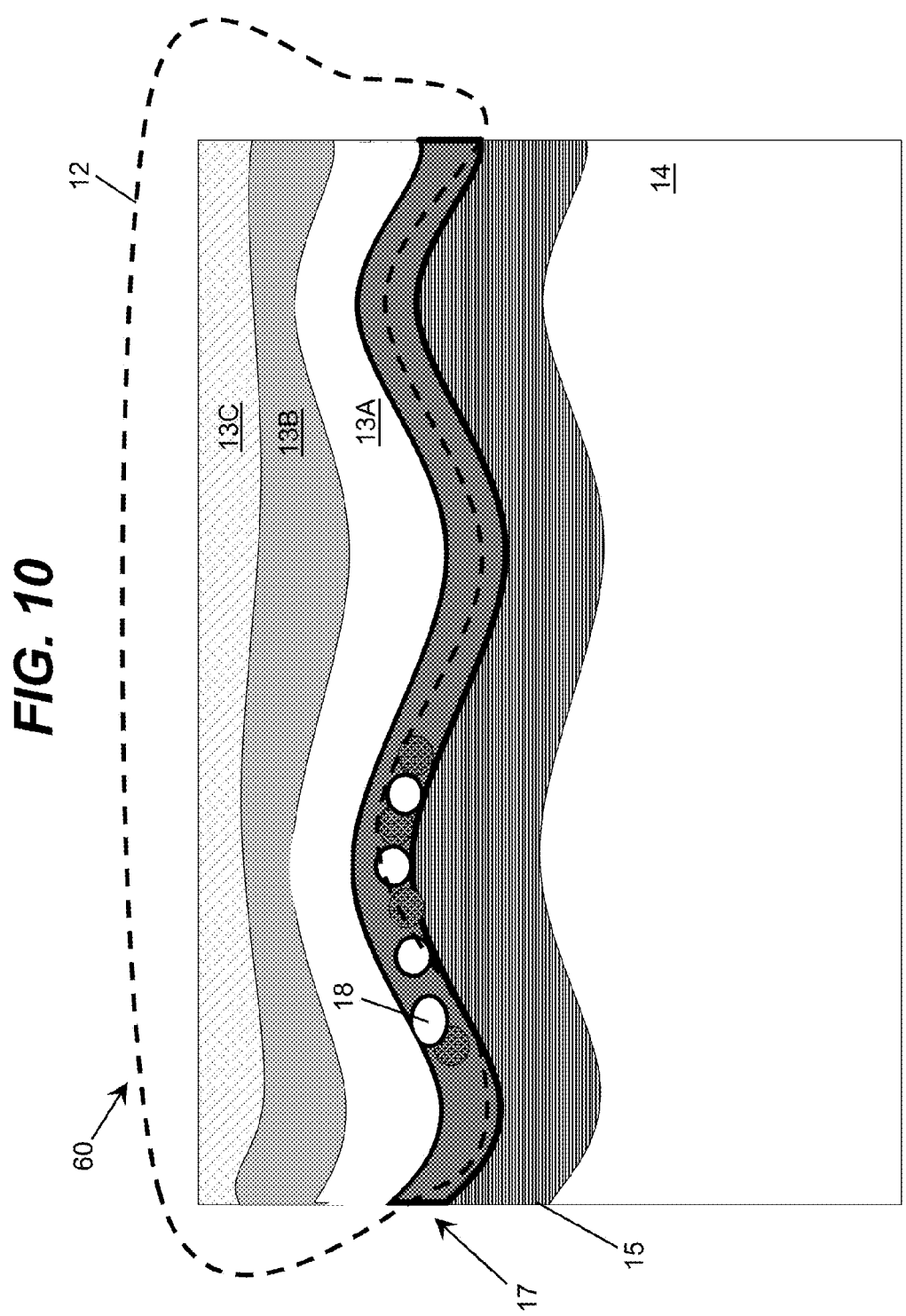

ULTRAVIOLET REFLECTIVE ROUGH ADHESIVE CONTACT

REFERENCE TO RELATED APPLICATIONS

The current application claims the benefit of U.S. Provisional Application No. 61/750,452, titled "Ultraviolet Light Emitting Diode with Rough Reflective Adhesive Contact," which was filed on 9 Jan. 2013, and which is hereby incorporated by reference.

TECHNICAL FIELD

The disclosure relates generally to contacts for semiconductors, and more particularly, to an ultraviolet reflective rough adhesive contact.

BACKGROUND ART

Group III nitride semiconductors are widely used for efficient blue and ultraviolet light emitting diodes, lasers, ultraviolet detectors, and field effect transistors. Due to a wide band-gap, group III nitride semiconductor materials are one of the prime choices for deep ultraviolet light emitting diodes (DUV LEDs). While there has been much advancement in improving the efficiency of DUV LEDs, the overall efficiency of these devices remains low. The wide band-gap of group III nitride semiconductor materials makes it difficult to form a good ohmic contact to the semiconductor layers. This can lead to resistive losses at the contact junction.

DUV LED devices frequently employ flip-chip technology in order to control light extraction and thermal management of DUV LED devices. For example, FIG. 1 illustrates a typical design of a flip-chip LED 2 according to the prior art. For flip-chip LEDs to have a high efficiency, it is desirable for the p-type contact 6 and the n-type contact 8 to be both ohmic and reflective, which allows each contact 6, 8 to serve as an electrode as well as a mirror for reflecting light emitted by an active region 4 out of the device 2. Additionally, it is desirable for the contacts 6, 8 to have stability during thermal cycling that occurs while packaging, as well as during operation of the device. Aluminum is a good reflecting metal, however, aluminum does not produce ohmic contact and is unstable during packaging.

Several types of metallic contacts have been proposed to improve ohmic contact to semiconductor layers. These contacts are formed of, for example: nickel/gold (Ni/Au), cobalt/gold (Co/Au), palladium/gold (Pd/Au), rhodium (Rh)-based, palladium/platinum/gold (Pd/Pt/Au), Pt/Ni/Au, Ni/Pt/Au, Ni/Pd/Au, and titanium/platinum/gold (Ti/Pt/Au) metallic layers. The thermal stability of Pd/Ni contacts is enhanced due to the formation of Pd gallides. Additionally, Pd/Ni contacts can lead to a reduction of contact resistivity. For Ni-based contacts, the Ni is easily oxidized above 400 degrees Celsius and the ohmic contact becomes worse at temperatures above 500 degrees Celsius.

One approach proposed a Pd/Ni/Al/Ti/Au metallization scheme for a contact with layers having corresponding thicknesses of 3 nm/2 nm/150 nm/20 nm/30 nm. This contact exhibited good thermal stability and reflectivity of sixty-two percent for radiation having a wavelength of 370 nm at normal incidence and good ohmic characteristics after annealing at three hundred degrees Celsius in nitrogen gas ($N_2$). It is further noted that the combination of Pd and Ni results in a good ohmic contact, while a contact without the presence of Ni results in larger resistance and non-linear behavior.

Most attempts at contact engineering have been for visible LEDs or near ultraviolet (UV) LEDs. For example, one approach found good ohmic properties for an iridium/silver (Ir/Ag) p-type contact with a seventy-five percent reflectivity for radiation with a wavelength of 405 nm. At the same wavelength, an indium-doped zinc oxide/silver (ZnO/Ag) contact has a reflectivity of 82.3%.

Other attempts at contact engineering for radiation near UV wavelengths have been proposed. For example, one approach proposed a nickel (Ni) "cleaning" mechanism. Residual oxide on the Gallium Nitride (GaN) surface was removed by Ni deposition and subsequent annealing. This resulted in better ohmic contact properties. Another approach proposed indium tin oxide (ITO) and zinc oxide (ZnO) contacts, instead of metallic contacts. However, for UV LEDs, different contacts are required in order to result in highly reflective UV mirrors.

The current application incorporates by reference U.S. Provisional Application No. 61/569,416 titled "Ultraviolet Reflective Contact," which was filed on 12 Dec. 2011. This provisional application outlines a contact that comprises at least two or more original sublayers which may comprise an ohmic sublayer, ohmic protection sublayer, reflective sublayer, reflector protective sublayer, conductive electrode sublayer and a final layer being dielectric adhesion layer. In addition to a metallic sublayer structure of the contact, the p-type group III semiconductor material also may contain a sublayered structure that may contain a thin layer of p-type GaN in the vicinity of the p-type contact together with a graded GaN—AlGaN region. Furthermore, a thin layer of $In_xAl_yGa_{1-x-y}N$ layer may be included in the vicinity of the p-type contact. The provisional application also considers the possibility of a contact having an inhomogeneous structure in a lateral direction, both in the metallic layers as well as composition in the underlying group III semiconductor layers.

SUMMARY OF THE INVENTION

The inventors have found that the above-described contacts to a semiconductor layer, such as a p-type group III-V semiconductor layer, can be improved. For example, a p-type contact for a group III-nitride based DUV LED can be improved to increase light extraction efficiency, while maintaining a low electrical resistance and a good contact adhesion between the contact and the semiconductor layer.

Aspects of the invention provide a device including a first semiconductor layer and a contact to the first semiconductor layer. An interface between the first semiconductor layer and the contact includes a first roughness profile having a characteristic height and a characteristic width. The characteristic height can correspond to an average vertical distance between crests and adjacent valleys in the first roughness profile. The characteristic width can correspond to an average lateral distance between the crests and adjacent valleys in the first roughness profile.

A first aspect of the invention provides a device comprising: a first semiconductor layer; and a contact to the first semiconductor layer, wherein an interface between the first semiconductor layer and the contact includes a first roughness profile having a characteristic height of at least three nanometers and a characteristic width of at least 0.1 micron.

A second aspect of the invention provides a device comprising: a first semiconductor layer; and a contact to the first semiconductor layer, wherein an interface between the first semiconductor layer and the contact includes a first roughness profile with a characteristic height and a characteristic width, wherein the characteristic height is an average vertical distance between adjacent crests and valleys of the first roughness profile, and is at least approximately three nanometers, and wherein the characteristic width is an average lateral distance between adjacent crests and valleys of the first roughness profile, and is within a range of approximately 0.1 micron to approximately fifty microns.

A third aspect of the invention provides a method comprising: fabricating a device, the device comprising: a first semiconductor layer; and a contact to the first semiconductor layer, wherein an interface between the first semiconductor layer and the contact includes a first roughness profile having a characteristic height of at least three nanometers and a characteristic width of at least 0.1 micron.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 2A-2B show portions of an illustrative device structure according to embodiments.

FIG. 3 shows a portion of an illustrative device structure according to an embodiment.

FIGS. 7A-7B show portions of illustrative device structures according to embodiments.

FIGS. 8A-8B show portions of illustrative device structures according to embodiments.

FIGS. 9A-9B show portions of illustrative device structures according to embodiments.

FIG. 10 shows a portion of an illustrative device structure according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
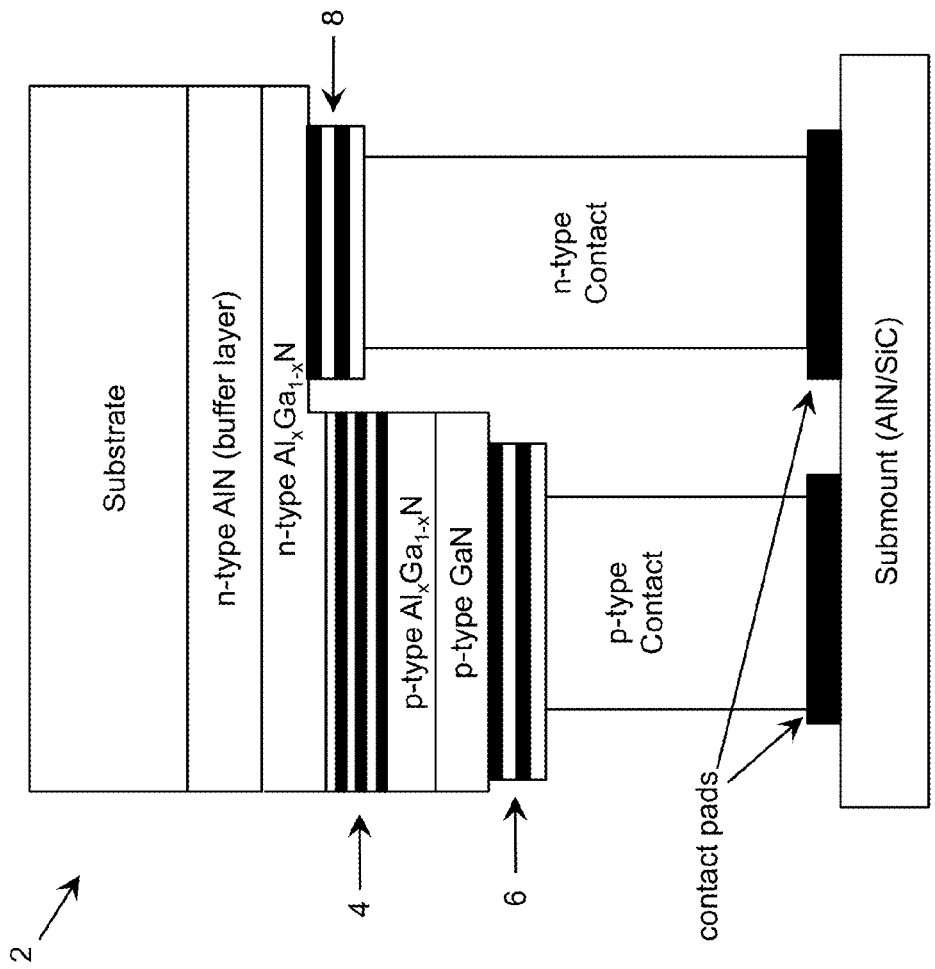
FIG. 1 shows a typical design of a flip-chip LED according to the prior art.

As indicated above, aspects of the invention provide a device including a first semiconductor layer and a contact to the first semiconductor layer. An interface between the first semiconductor layer and the contact includes a first roughness profile having a characteristic height and a characteristic width. The characteristic height can correspond to an average vertical distance between crests and adjacent valleys in the first roughness profile. The characteristic width can correspond to an average lateral distance between the crests and adjacent valleys in the first roughness profile. As used herein, unless otherwise noted, the term "set" means one or more (i.e., at least one) and the phrase "any solution" means any now known or later developed solution.

Furthermore, it is understood that a contact formed between two layers is considered "ohmic" or "conducting" when an overall resistance of the contact is no larger than the larger of the following two resistances: a contact resistance such that a voltage drop at the contact-semiconductor junction is no larger than two volts; and a contact resistance at least five times smaller than a resistance of a largest resistive element or layer of a device including the contact. In an embodiment, the largest resistive element is an active region of the corresponding device (e.g., a resistance of the active region 4 of the LED shown in FIG. 1). As used herein, a layer/material is considered "transparent" if it allows at least approximately ten percent of electromagnetic radiation in a corresponding range of radiation wavelengths to pass there through. Similarly, a layer/material is considered "reflective" if it reflects at least approximately ten percent of electromagnetic radiation in a corresponding range of radiation wavelengths.

Turning to the drawings, FIG. 2A shows an illustrative portion of a device 10 according to an embodiment. The device 10 includes a contact 12 and a semiconductor layer 14. The contact 12 can be implemented as a p-type or n-type contact for any type of semiconductor device 10. The contact 12 can include a plurality of metallic layers, a plurality of oxide layers, a plurality of nitride layers, and/or the like. In an embodiment, the contact 12 is implemented on a device 10 configured to operate as a light emitting device, such as a conventional or super luminescent light emitting diode (LED), a laser diode (LD), and/or the like. For example, the contact 12 can be formed on a flip-chip LED, which is configured similar to the LED 2 (FIG. 1), e.g., in place of one or both of the contacts 6, 8 shown thereon. However, it is understood that a flip-chip LED is only illustrative of various types of semiconductor devices for which one or more of the contacts 12 can be utilized.

While aspects of the invention are generally shown and described herein with respect to improving extraction of light from an emitting device, it is understood that aspects of the invention further provide various alternative embodiments. For example, aspects of the invention can be implemented to facilitate the transmission of light within the device, e.g., as part of optical pumping of a laser light generating structure, excitation of a carrier gas using a laser pulse, and/or the like. Similarly, an embodiment of the invention can be implemented in conjunction with a sensing device, such as a photosensor or a photodetector. In each case, a contact described herein can be included in order to facilitate the reflection of light in a desired direction.

The electromagnetic radiation emitted or sensed by a device including a contact described herein can comprise a peak wavelength within any range of wavelengths, including visible light, ultraviolet radiation, infrared light, and/or the like. In an embodiment, the device is configured to generate and/or sense radiation having a peak wavelength in the ultraviolet spectrum (e.g., an ultraviolet device). In a more particular embodiment, the ultraviolet device is configured to emit and/or detect radiation having a peak wavelength in the deep ultraviolet radiation spectrum.

In an embodiment, the emitting or sensing device is a group III-V materials based device, in which some or all of the various layers are formed of elements selected from the group III-V materials system. In a more particular illustrative embodiment, the various layers of the device are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

The contact 12 can be to any of various types of semiconductor layers 14, including: an $Al_xIn_yB_zGa_{1-x-y-z}N$ semiconductor layer 14; a p-type semiconductor layer 14 comprising at least one of: titanium doped indium oxide, nickel oxide, cobalt oxide, vanadium nitride, chromium nitride, or $Me_2$(AlGaN), where Me is selected from the group of elements consisting of: Ag, Pd, Ni, Co, or Pt; a n-type semiconductor layer 14 comprising at least one of: titanium doped indium oxide, nickel oxide, titanium nitride, tantalum nitride, zirconium nitride, hafnium nitride, or $Me_2$(AlGaN), where Me is selected from the group of elements consisting of: Zr, Hf, V, Nb, W, Mo, Cr, Ti, or Ta; and/or the like.

In any event, an interface 16 between the contact 12 and the semiconductor layer 14 can include a roughness profile 19. Although the roughness profile 19 is shown as a smooth periodic waveform, it is understood that this is only illustrative. For example, the roughness profile 19 can be an aperiodic; can include any waveform shape, such as a square, a triangle, a sawtooth, and/or the like; etc. To this extent, FIG. 2B shows a close up view of a portion of an illustrative interface 16B. As illustrated, the interface 16B can include stepped portions of the semiconductor layer 14B and a plurality of islands 12B of a metal of the contact 12.

Returning to FIG. 2A, the roughness profile 19 for the interface 16 can be configured to increase a surface area between the metallic contact 12 and the semiconductor layer 14, which can promote metal-to-semiconductor contact. The increase in surface area between the contact 12 and the semiconductor layer 14 decreases the contact resistance and improves adhesion between the contact 12 and the semiconductor layer 14. The roughness profile 19 at the interface 16 can also improve adhesion of the contact 12 to the semiconductor layer 14. Furthermore, the roughness profile can promote light scattering, which decreases wave guiding of light though the LED structure 10. A characteristic height "H" for the roughness profile 19 can be calculated as an average vertical distance between adjacent crests and valleys of the roughness profile. A characteristic width "W" for the roughness profile 19 can be calculated as an average lateral distance between adjacent crests and valleys of the roughness profile. In an embodiment, the characteristic height "H" is at least approximately three nanometers, while the characteristic width "W" is at least approximately 0.1 micron. In a more specific embodiment, the characteristic width "W" is within a range of approximately one micron to approximately fifty microns. In an embodiment, the value of the characteristic width "W" is selected to be on the order of or less than a thickness of the characteristic length of the current spreading in the structure to which the contact 12 is made. In a more specific embodiment, the characteristic height "H" is between 3 and 20 nanometers. The characteristic height "H" can be selected to be on the order or less than approximately ten percent of a thickness of the semiconductor layer 14, which can ensure that the semiconductor layer 14 behaves as a single layer.

In an embodiment, the interface 16 between the contact 12 and the semiconductor layer 14 can include multiple roughness profiles of different scales. Each roughness profile can be configured based on a target function using any solution. For example, FIG. 3 shows a portion of an illustrative device 30 according to an embodiment. The interface 16 includes a first roughness profile 19A and a second roughness profile 19B. The first roughness profile 19A and the second roughness profile 19B have distinct scales from one another. For example, the second roughness profile 19B can have a characteristic width that is at least approximately five times smaller than the characteristic width of the first roughness profile 19A. In this case, the second roughness profile 19B can be used to target efficient light scattering, while the first roughness profile 19A can be used to improve contact-to-semiconductor adhesion and conductivity. Furthermore, the first roughness profile 19A can be used to improve reflectivity and/or scattering of the light, while the second roughness profile 19B can be used to target an improved conductivity.

The roughness profiles 19A, 19B can be fabricated using any combination of deposition and/or etching. For example, the fabrication can include selective deposition and/or etching of nanoscale objects, such as nanodots and/or nanorods, of the material to form the large and/or small roughness components described herein. Such deposition and/or etching can be used to form periodic and/or non-periodic random patterns. Furthermore, the geometrical and/or optical roughness of each roughness profile can be formed by at least one of: standard photolithography, holographic photolithography, or a process that forms self-associated clusters of a composite layer via dry or wet etching. In an embodiment, a thin layer can be deposited over the semiconductor layer 14 with growth conditions that enhance three-dimensional growth and nuclei formation, such as a large aluminum composition (e.g., greater than approximately twenty percent), a lower growth temperature (e.g., less than one thousand Celsius), and a higher V-III ratio (e.g., greater than five thousand).

Figure 4:
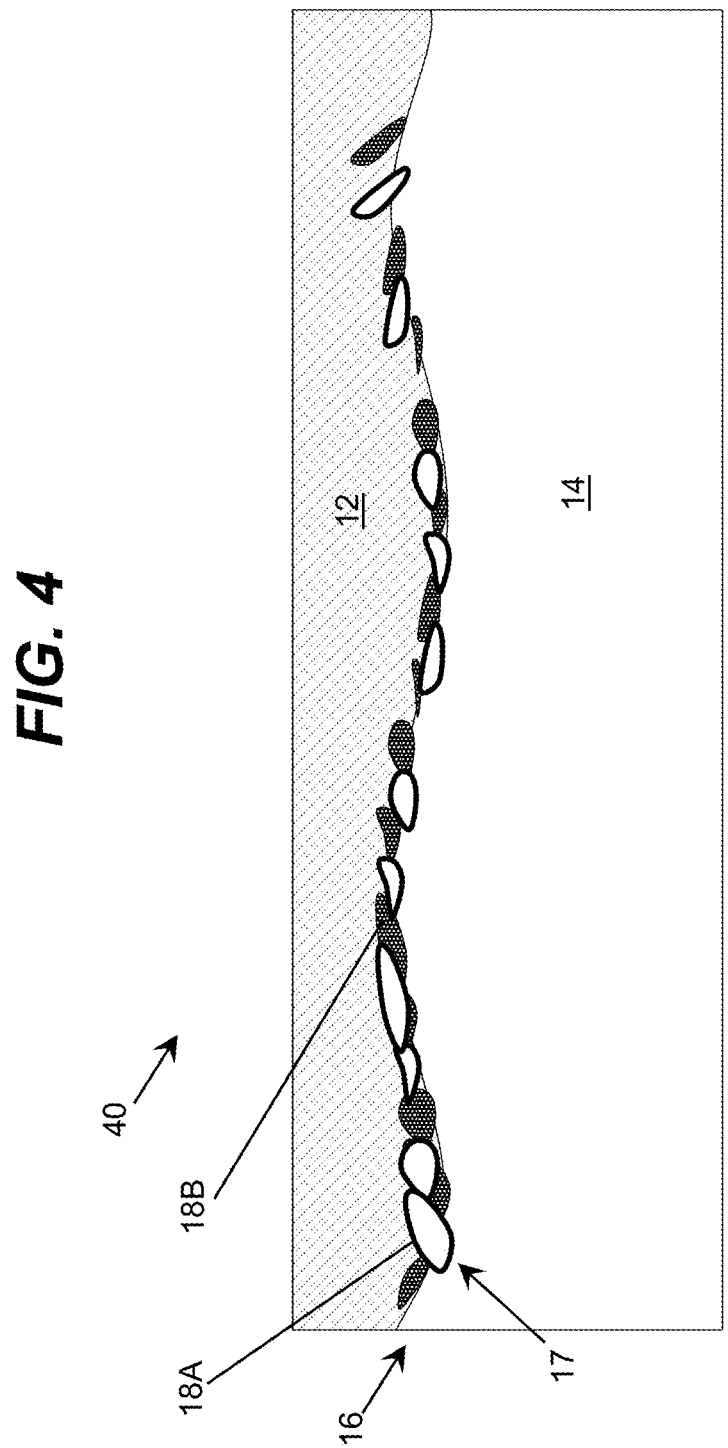
FIG. 4 shows a portion of an illustrative device structure according to an embodiment.

FIG. 4 shows an illustrative portion of a device 40 according to another embodiment. In this case, the interface 16 between the contact 12 and the semiconductor layer 14 is shown including an interlayer 17. In an embodiment, the interlayer 17 includes a plurality of different types of islands 18A, 18B. Each island 18A, 18B can have any shape and/or size. The plurality of types of islands 18A, 18B can include islands formed of: a conducting material, such as a metal-based alloy, including cobalt, aluminum, and/or the like; an oxide, including indium tin oxide (ITO); a nitride; and/or the like. In an embodiment, the plurality of islands 18A, 18B can also include graphene islands. Some or all of the plurality of islands 18A, 18B in the interlayer 17 can be configured to decrease contact resistance between the contact 12 and the first semiconductor layer 14. It is understood that the interlayer 17 can include any number of types of islands 18A, 18B. For example, the interlayer 17 can include a first type of island 18A and a second type of island 18B.

Figure 5:
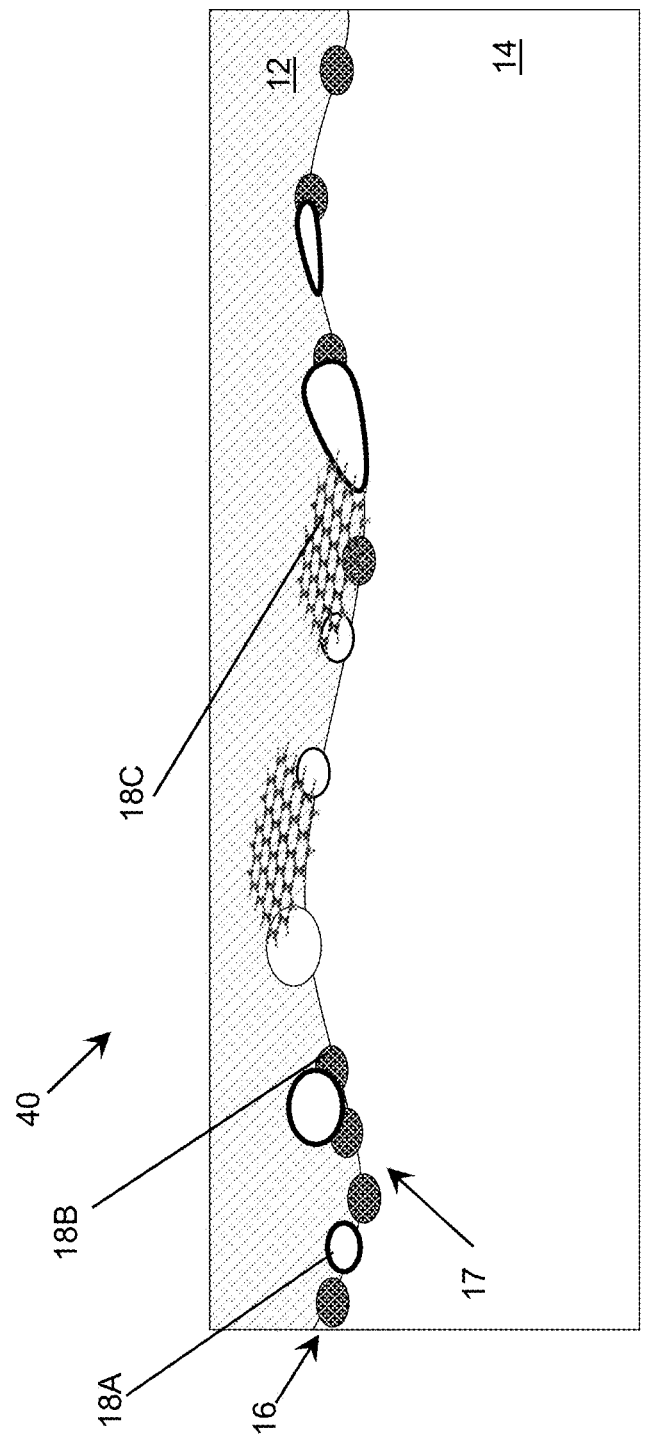
FIG. 5 shows a portion of an illustrative device structure according to an embodiment.

In an embodiment, the first type of island 18A can include a metal-based alloy having a high adhesion to the semiconductor layer 14. For example, the high adhesion materials for the first type of island 18A can be metallic alloys having a work function higher than 4.5 eV, such as cobalt (Co), titanium, (Ti), gallium nitride (GaN), and/or the like. In an embodiment, the metals have a high adhesion to a semiconductor layer 14 comprising AlGaN with a content of gallium that is at least approximately forty percent. The second type of islands 18B can be formed of metals that result in a low specific resistance contact to the semiconductor layer 14 (e.g., good ohmic contact between the contact 12 and the semiconductor layer 14). In an embodiment, the resistance is lower than $10^{-4}$ ohm*$cm^2$. For example, illustrative materials for the second type of islands 18B include nickel (Ni), platinum (Pt), palladium (Pd), and/or the like. As shown in FIG. 5, the interlayer 17 can also include islands 18C of still another type. For example, the islands 18C can comprise graphene islands 18C, which can be included to decrease a lateral resistance between the metallic islands 18A, 18B.

Figure 6:
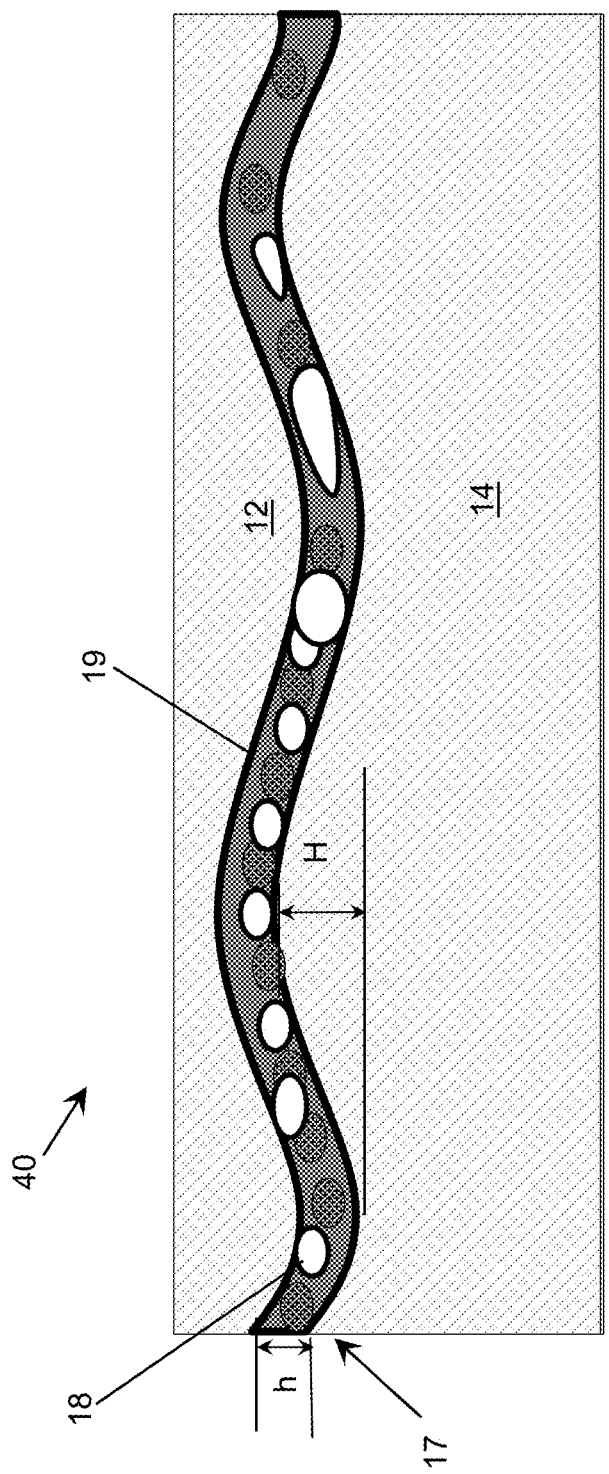
FIG. 6 shows a portion of an illustrative device structure according to an embodiment.

In an embodiment, the interlayer 17 is sufficiently thin to promote the formation of metallic islands 18A-18C, rather than connected region(s). The interlayer 17 also can serve as a thin contact and/or adhesive layer, which does not significantly alter the light reflective characteristics of the device 40 that are mainly controlled by the contact 12. To this extent, as seen in FIG. 6, a thickness "h" of the interlayer 17, e.g., as measured by the characteristic thickness of the islands 18 forming the interlayer 17, can be smaller than the characteristic height "H" of the roughness profile 19.

Turning now to illustrative portions of devices 40A, 40B shown in FIGS. 7A-7B, a second semiconductor layer 15 can be located between the contact 12 and the first semiconductor layer 14. The second semiconductor layer 15 can be configured to, for example, promote ohmic contact between the contact 12 and the first semiconductor layer 14. In an embodiment, the first semiconductor layer 14 can be formed of a material at least fifty percent transparent to a radiation having a target wavelength and the second semiconductor layer 15 can be a highly p-doped semiconductor material. For example, the second semiconductor layer 15 can be a thin layer of highly doped gallium nitride (GaN), a layer with low aluminum content, and/or the like. In one embodiment, the second semiconductor layer 15 can be $Al_xIn_yGa_{1-x-y}N$, where the gallium content (1-x-y) is greater than 0.8. As shown in FIG. 7A, the second semiconductor layer 15 can be laterally homogenous.

However, in another embodiment shown in FIG. 7B, the second semiconductor can be laterally inhomogeneous. For example, the second semiconductor can include distinct lateral regions 15A, 15B providing inhomogeneous conductive and/or transparent properties in the lateral direction of the second semiconductor. The second semiconductor can include a first plurality of regions of high conductivity 15A, and a second plurality of regions 15B that are partially transparent. The regions of high conductivity 15A are measured by an amount of voltage drop across through the second semiconductor regions 15A. In an embodiment, the first regions 15A includes a total voltage drop that is less than twenty percent of a total operational voltage of the device 40B. The second region 15B can be at least approximately ten percent transparent to radiation having a target wavelength. The inhomogeneous second semiconductor can be formed using any solution, e.g., by semiconductor patterning, and/or the like.

An interlayer 17 can be located between the second semiconductor layer 15 and the contact 12. As shown in FIGS. 8A-8B, the interlayer 17 can be located adjacent to a laterally homogenous second semiconductor layer 15 as shown in FIG. 8A, or adjacent to a laterally inhomogeneous second semiconductor layer, including a first region 15A and a second region 15B as shown in FIG. 8B. The interlayer 17 can be formed through, for example, semiconductor patterning, and/or the like. Turning now to FIG. 9A, the patterning of the interlayer 17 and the second semiconductor layer 15 can be correlated, so that regions of high conductivity in the second semiconductor layer (e.g., 15A) coincide with regions of high conductivity 22A in the interlayer 17. Furthermore, the regions of high transparency for the second semiconductor layer (e.g., 15B) can coincide with the regions of high adhesion 22B in the interlayer 17. Alternatively, as shown in FIG. 9B, the regions of high conductivity 15A may not coincide with regions of high conductivity 22A in the interlayer 17, and the regions of high transparency 15B may not coincide with the regions of high adhesion 22B in the interlayer 17.

Formation of the interlayer 17 and a laterally inhomogeneous second semiconductor layer can be performed using any solution. In an embodiment, the patterning process for forming the laterally inhomogeneous interlayer 17 and the laterally inhomogeneous second semiconductor begins with depositing a mask onto a surface of the semiconductor layer 14. The unmasked portions of the semiconductor layer 14 can be etched to a particular depth, and a second semiconductor material is regrown in the etched regions (e.g., forming second semiconductor 15). The regrown semiconductor material can differ from the semiconductor material of the semiconductor layer 14 by at least one of: a composition, a doping, or a V-III ratio. This forms the laterally inhomogeneous second semiconductor 15.

The interlayer 17 (including at least one of: a metal, an oxide, and/or graphene) can be deposited over the second semiconductor 15. The interlayer 17 can be deposited by means of thermal evaporation, magnetron sputtering, ion-beam deposition, laser beam evaporation, and/or the like. Another mask can be applied over the interlayer 17 and the unmasked portions of the interlayer 17 can be etched. In an embodiment, the second mask is patterned to etch regions similar to the first mask (e.g., so that the patterning of interlayer 17 correlates to the patterning of the second semiconductor 15). In an alternative embodiment, the second mark is patterned to etch regions dissimilar to the first mask, so that these regions may or may not coincide. Subsequently, a new interlayer material can be deposited into the etched regions. The new interlayer material differs from the first interlayer material by electrical and/or optical properties. For example, the first interlayer material can be Co, while the second interlayer material deposited into the etched regions is Ni or Pd. This forms the laterally inhomogeneous interlayer 17.

Once the second semiconductor 15 and the interlayer 17 are patterned and formed, the contact 12 is formed over the interlayer 17. Forming the contact 12 can include depositing a metallic layer over the interlayer 17. In an embodiment, the interlayer 17 and/or underlying semiconductor layer 14 are etched using the metallic layer as a mask, and a reflective material can be deposited into the etched regions. In this case, the metallic layer and the reflective material form the contact 12.

Additional layers can be deposited if the contact 12 includes a plurality of sub-layers. For example, FIG. 10 shows a portion of an illustrative device 60 according to an embodiment. The device 60 includes a contact 12 with a plurality of sub-layers 13A, 13B, 13C. Each sub-layer can be formed of a material configured to provide a specific function. A first sub-layer 13A can be protective and can be formed of, for example, rhodium (Rh), palladium (Pd), platinum (Pt), iridium (Ir), and/or the like. A second sub-layer 13B can be highly reflective to radiation having a target wavelength and can be formed of, for example, aluminum (Al), rhodium (Rh), and/or the like. A third sub-layer 13C can comprise a material that has a low resistance and high heat conductivity and can be formed of, for example, gold (Au), titanium (Ti), nickel (Ni), molybdenum (Mo), and/or the like. Although the contact 12 including a plurality of sub-layers 13A, 13B, 13C is shown in FIG. 10 in conjunction with the embodiment including the second semiconductor 15, it is understood that a contact 12 including a plurality of sub-layers 13A, 13B, 13C is applicable to any of the embodiments of an interface discussed herein. Furthermore, the contact 12 can include any number of sub-layers.

One or more attributes of a roughness of the interface between the metallic contact 12 and the semiconductor layer 14 (or second semiconductor layer 15, if present) can be selected and configured to promote adhesion between the layers. The selection of roughness attributes to improve adhesion is dependent on the type of semiconductor materiel forming the semiconductor layer 14 and the type of metal at the interface with the semiconductor layer 14. In general, roughness can be improved by introducing some roughness, e.g., through etching or by selecting appropriate epitaxial growth conditions of the semiconductor layer 14. In an embodiment, a height of the roughness, which can be measured as an average peak/valley distance, is less than approximately twenty nanometers.

For a contact 12 including a plurality of sub-layers 13A-13C, a first metallic sub-layer 13A of the contact 12 can have a thickness of at least one half of the height of the roughness. Furthermore, the entire contact 12 can be at least as thick as the height of the roughness. Formation of a metallic contact 12 to a p-type GaN semiconductor layer can include annealing the contact 12 at a temperature in a range of 450 to 600 Celsius, which provides good conductivity and adhesion.

The morphology of an interlayer 17 including metallic islands 18 can be controlled through annealing and the selection of metallic sub-layers. As used herein, the morphology of the interlayer 17 refers to the characteristic sizes of the resulting annealed islands. Inclusion of the interlayer 17 also can affect adhesion of the contact 12. For example, in an embodiment, a nickel metallic layer (e.g., islands 18) is used at the metal contact/semiconductor interface followed by a gold metallic layer (e.g., sub-layer 13A). Adhesion of the metal contact 12 to the semiconductor 14 can be measured using any standard adhesion test including, for example, the scotch tape test, ninety degree peel test, scratch test, and the like. Furthermore, the die shear test can be used to evaluate contact adhesion to the die.

Figure 11:
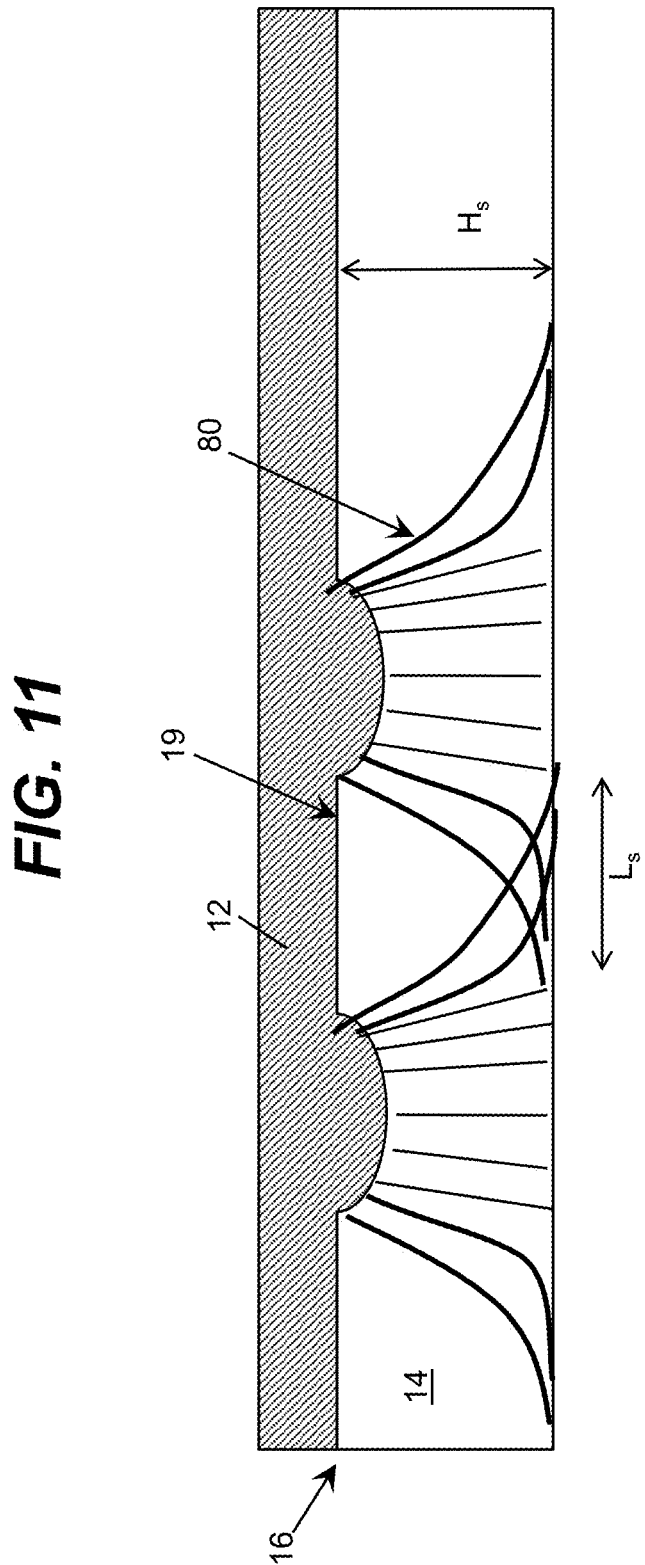
FIG. 11 shows illustrative current spreading lines at an interface between a contact and a semiconductor layer according to an embodiment.

Roughness also can be configured based on current spreading. For example, FIG. 11 shows illustrative current spreading lines 80 at an interface 16 between a contact 12 and a semiconductor layer 14 according to an embodiment. As illustrated, the current spreads a distance $L_s$, which is comparable to a thickness of the semiconductor layer $H_s$. In an embodiment, the roughness profile 19 of the interface 16 includes two scales, where a first scale is configured based on current spreading and the second scale is configured for adhesion. In a more specific embodiment, the first scale can have a characteristic width in a range of 10% to 1000% of the thickness of the semiconductor layer $H_s$. The second scale can be determined using an adhesion test. For example, several different roughness scale samples can be evaluated for the second scale, and a target scale can be selected based results of the evaluation.

As described herein, the interface described herein can be incorporated into any of various types of heterostructures/devices, including an emitting device such as a flip-chip LED shown in FIG. 1. It is understood that fabrication of the emitting device/heterostructure can be performed using any solution. For example, fabrication of the device 10 can include the deposition and removal of a temporary layer, such as mask layer, the patterning one or more layers, the formation of one or more additional layers not shown, and/or the like.

Figure 12:
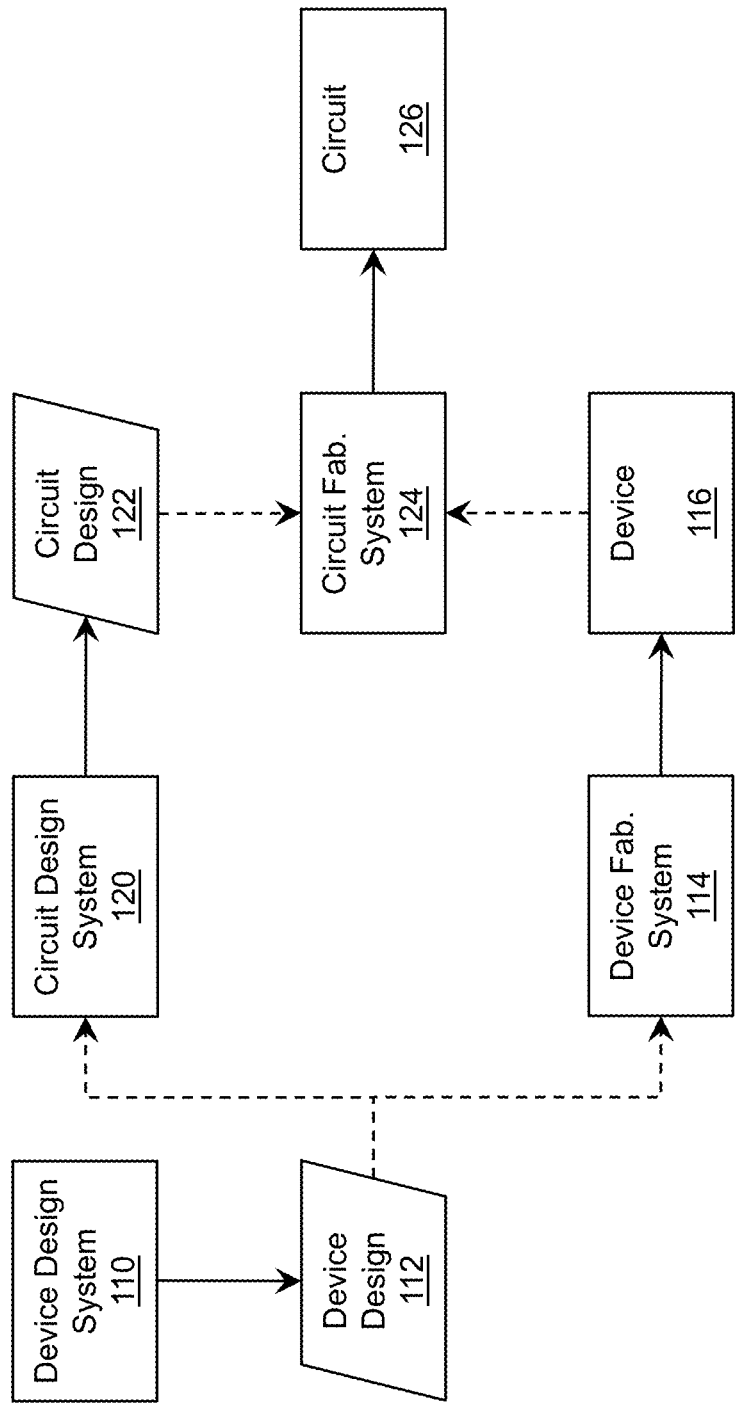
FIG. 12 shows an illustrative flow diagram for fabricating a circuit according to an embodiment.

In one embodiment, the invention provides a method of designing and/or fabricating a circuit that includes one or more of the devices designed and fabricated as described herein (e.g., including one or more contacts configured as described herein). To this extent, FIG. 12 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
   a first semiconductor layer;
   a contact to the first semiconductor layer, wherein an interface between the first semiconductor layer and the contact includes a first roughness profile having a characteristic height of at least three nanometers and a characteristic width of at least 0.1 micron; and
   an interlayer located between the first semiconductor layer and the contact, wherein the interlayer comprises a plurality of islands each having a closed boundary that is separate from the first semiconductor layer and the contact, wherein some of the plurality of islands have a boundary that extends into both the first semiconductor layer and the contact.

2. The device of claim 1, wherein the characteristic height is an average vertical distance between adjacent crests and valleys of the first roughness profile.

3. The device of claim 1, wherein the characteristic width is an average lateral distance between adjacent crests and valleys of the first roughness profile.

4. The device of claim 3, the interface between the contact and the first semiconductor layer further including a second roughness profile, wherein a characteristic width of the second roughness profile is at least five times smaller than the characteristic width of the first roughness profile.

5. The device of claim 1, the interface between the contact and the first semiconductor layer further including a second roughness profile, wherein the first roughness profile is configured based on adhesion of the contact to the first semiconductor layer and the second roughness profile is configured based on current spreading in the first semiconductor layer.

6. The device of claim 1, wherein the plurality of islands includes islands formed of at least one of: a metal, an oxide, a nitride, or graphene.

7. The device of claim 6, wherein a thickness of the interlayer is less than the characteristic height of the first roughness profile.

8. The device of claim 1, further comprising a second semiconductor layer located between the first semiconductor layer and the contact, wherein the second semiconductor layer is configured to improve an ohmic contact between the first semiconductor layer and the contact.

9. The device of claim 8, wherein the second semiconductor is laterally inhomogeneous and comprises a first plurality of regions of a first type and a second plurality of regions of a second type, wherein the first type includes a first material having a high conductivity that includes a total voltage drop of less than twenty percent of a total operational voltage of the device, and the second type includes a second material transparent to radiation of a target wavelength.

10. The device of claim 1, the contact including a plurality of sublayers, wherein each sublayer includes a metal distinct from a metal of the other sublayers.

11. A device comprising:
    a first semiconductor layer;
    a contact to the first semiconductor layer, wherein an interface between the first semiconductor layer and the contact includes a first roughness profile with a characteristic height and a characteristic width, wherein the characteristic height is an average vertical distance between adjacent crests and valleys of the first roughness profile, and is at least approximately three nanometers, and wherein the characteristic width is an average lateral distance between adjacent crests and valleys of the first roughness profile, and is within a range of approximately 0.1 micron to approximately fifty microns; and
    an interlayer located between the first semiconductor layer and the contact, wherein the interlayer comprises a plurality of islands each having a closed boundary that is separate from the first semiconductor layer and the contact, wherein some of the plurality of islands have a boundary that extends into both the first semiconductor layer and the contact.

12. The device of claim 11, the interface between the contact and the first semiconductor layer further including a second roughness profile, wherein a characteristic width of the second roughness profile is at least five times smaller than the characteristic width of the first roughness profile.

13. The device of claim 11, the interface between the contact and the first semiconductor layer further including a second roughness profile, wherein the first roughness profile is configured based on adhesion of the contact to the first semiconductor layer and the second roughness profile is configured based on current spreading in the first semiconductor layer.

14. The device of claim 11, wherein the plurality of islands includes islands formed of at least one of: a metal, an oxide, a nitride, or graphene.

15. The device of claim 14, wherein a thickness of the interlayer is less than the characteristic height of the first roughness profile.

16. The device of claim 11, further comprising a second semiconductor layer located between the first semiconductor layer and the contact, wherein the second semiconductor layer is configured to improve an ohmic contact between the first semiconductor layer and the contact.

17. The device of claim 16, wherein the second semiconductor layer is laterally inhomogeneous and comprises a plurality of regions of a first type and a second type, the first type including a material having a high conductivity that includes a total voltage drop of less than twenty percent of a total operational voltage of the device, and the second type including a material being transparent to radiation of a target wavelength.

18. The device of claim 11, the contact including a plurality of sublayers, wherein each sublayer includes a metal distinct from a metal of the other sublayers.

19. A method comprising:
fabricating a device, the device comprising:
  a first semiconductor layer;
  a contact to the first semiconductor layer, wherein an interface between the first semiconductor layer and the contact includes a first roughness profile having a characteristic height of at least three nanometers and a characteristic width of at least 0.1 micron; and
  an interlayer located between the first semiconductor layer and the contact, wherein the interlayer comprises a plurality of islands each having a closed boundary that is separate from the first semiconductor layer and the contact, wherein some of the plurality of islands have a boundary that extends into both the first semiconductor layer and the contact.

20. The method of claim 19, wherein the fabricating includes:
  depositing an interlayer over the first semiconductor layer;
  patterning the interlayer;
  depositing a metallic layer over the interlayer;
  etching at least one of: the interlayer or the semiconductor layer using the metallic layer as a mask; and
  depositing a reflective material into the etched regions.

21. The method of claim 20, wherein the metallic layer and the reflective material form at least a portion of the contact.

22. The method of claim 19, wherein the fabricating includes depositing a second semiconductor layer over the first semiconductor layer, wherein the second semiconductor layer is located between the contact and the first semiconductor layer.

23. The device of claim 1, wherein some of the plurality of islands have boundary portions that are in contact with boundary portions of adjacent islands.

* * * * *